United States Patent
Kim et al.

(10) Patent No.: US 11,380,383 B2
(45) Date of Patent: Jul. 5, 2022

(54) ELECTRONIC DEVICE FOR CONTROLLING COMMAND INPUT

(71) Applicant: SK hynix Inc., Icheon-si (KR)

(72) Inventors: Kyung Mook Kim, Icheon-si (KR); Woongrae Kim, Icheon-si (KR); Geun Ho Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 120 days.

(21) Appl. No.: 17/011,496

(22) Filed: Sep. 3, 2020

(65) Prior Publication Data

US 2021/0366535 A1 Nov. 25, 2021

(30) Foreign Application Priority Data

May 19, 2020 (KR) .................. 10-2020-0060031

(51) Int. Cl.
| | |
|---|---|
| *G11C 7/00* | (2006.01) |
| *G11C 11/406* | (2006.01) |
| *G11C 11/4076* | (2006.01) |
| *G11C 11/408* | (2006.01) |

(52) U.S. Cl.
CPC .... *G11C 11/40618* (2013.01); *G11C 11/4076* (2013.01); *G11C 11/4082* (2013.01); *G11C 11/40607* (2013.01); *G11C 11/40615* (2013.01)

(58) Field of Classification Search
CPC ........ G11C 11/40618; G11C 11/40607; G11C 11/40615; G11C 11/4076; G11C 11/4082
See application file for complete search history.

(56) References Cited

U.S. PATENT DOCUMENTS

| | | | |
|---|---|---|---|
| 6,594,770 B1 | 7/2003 | Sato et al. | |
| 2003/0085731 A1* | 5/2003 | Iwase | G11C 29/46 326/16 |
| 2021/0335416 A1* | 10/2021 | Joo | G11C 11/40615 |

FOREIGN PATENT DOCUMENTS

KR         100945940 B1     3/2010

* cited by examiner

*Primary Examiner* — Tuan T Nguyen
(74) *Attorney, Agent, or Firm* — William Park & Associates Ltd.

(57) ABSTRACT

An electronic device includes a command generation circuit configured to generate a refresh command and a driving control signal, which are enabled during an all-bank refresh operation, according to a logic level combination of an internal chip selection signal and an internal command address. The electronic device also includes a buffer control circuit configured to generate, from the refresh command and the driving control signal, a first buffer enable signal for enabling a first group of buffers and a second buffer enable signal for enabling a second group of buffers.

20 Claims, 19 Drawing Sheets

FIG. 3

| OPERATION | ICS | ICA<1> | ICA<2> | ICA<3> | ICA<4> | ICA<5> | ICA<6> | ICA<7> | ICA<8> | ICA<9> | ICA<10> | ICA<11> |
|---|---|---|---|---|---|---|---|---|---|---|---|---|
| REFRESH ALL BANK | L | H | H | L | L | H | X | X | X | X | X | L |
| REFRESH SAME BANK | L | H | H | L | L | H | X | X | X | X | X | H |
| WRITE | L | H | L | H | H | L | X | X | X | X | X | X |
| READ | L | H | L | H | H | H | X | X | X | X | X | X |

ELECTRONIC DEVICE FOR CONTROLLING COMMAND INPUT

CROSS-REFERENCES TO RELATED APPLICATION

The present application claims priority under 35 U.S.C. § 119(a) to Korean application number 10-2020-0060031, filed on May 19, 2020, which is incorporated by reference in its entirety.

BACKGROUND

1. Technical Field

Various embodiments generally relate to an electronic device for controlling buffer enable during a refresh operation.

2. Related Art

In general, a semiconductor device including DDR SDRAM (Double Data Rate Synchronous DRAM) performs a write operation of storing data, a read operation of outputting data, and a refresh operation of sensing and amplifying data of a memory cell, according to a command inputted from an external chip set. The semiconductor device needs to perform an active operation in order to perform the write operation, the read operation, and the refresh operation. The semiconductor device generates an internal command for performing an active operation according to a command and address inputted through a command address pin, and sort commands, which are sequentially inputted, using a chip selection signal.

Various methods of the refresh operation are suggested for a high-speed operation of the semiconductor device. Examples of the suggested refresh operation include an all-bank refresh operation of refreshing all of a plurality of banks included in a core circuit of the semiconductor device and a same-back refresh operation of performing a refresh operation on only some banks of the plurality of banks included in the core circuit and performing a write/read operation on the other banks.

SUMMARY

Various embodiments are directed to an electronic device capable of reducing current consumption by disabling buffers which receive some command addresses during a refresh operation.

In an embodiment, an electronic device may include a command generation circuit configured to generate a refresh command and a driving control signal, which are enabled during an all-bank refresh operation, according to a logic level combination of an internal chip selection signal and an internal command address. The electronic device may also include a buffer control circuit configured to generate, from the refresh command and the driving control signal, a first buffer enable signal for enabling a first group of buffers and a second buffer enable signal for enabling a second group of buffers.

In an embodiment, an electronic device may include a command generation circuit configured to generate a refresh command and a driving control signal, which are enabled during an all-bank refresh operation, according to a logic level combination of an internal chip selection signal, a first group of internal command addresses, and a second group of internal command addresses, and configured to generate an internal command by detecting a logic level combination of the internal chip selection signal and the second group of internal command addresses during the all-bank refresh operation. The electronic device may also include a buffer control circuit configured to generate, from the refresh command and the driving control signal, a first buffer enable signal for enabling a first group of buffers and a second buffer enable signal for enabling a second group of buffers.

In accordance with the present embodiments, the electronic device can disable buffers which receive some command addresses during the all-bank refresh operation of the refresh operation, thereby reducing the current consumption.

Furthermore, the electronic device may detect the logic level of the command address received through the buffer which receives some command addresses during the refresh operation, and perform internal operations. Thus, the internal operations may be efficiently performed.

BRIEF DESCRIPTION OF THE DRAWINGS

FIG. 3 is a table showing logic levels of an internal chip selection signal and an internal command address for performing a refresh operation and an internal operation of the electronic device illustrated in FIG. 1.

DETAILED DESCRIPTION

The term "preset" indicates that the value of a parameter is previously decided, when the parameter is used in a process or algorithm. According to an embodiment, the value of the parameter may be set when the process or algorithm is started or while the process or algorithm is performed.

The terms such as "first" and "second," which are used to distinguish among various components, are not limited by the components. For example, a first component may be referred to as a second component, and vice versa.

When one component is referred to as being "coupled" or "connected" to another component, it may indicate that the components are directly coupled or connected to each other or coupled or connected to each other through another component interposed therebetween. On the other hand, when one component is referred to as being "directly coupled" or "directly connected" to another component, it may indicate that the components are directly coupled or connected to each other without another component interposed therebetween.

"Logic high level" and "logic low level" are used to describe the logic levels of signals. A signal having "logic high level" is distinguished from a signal having "logic low level." For example, when a signal having a first voltage corresponds to "logic high level," a signal having a second voltage may correspond to "logic low level." According to an embodiment, "logic high level" may be set to a voltage higher than "logic low level." According to an embodiment, the logic levels of signals may be set to different logic levels or opposite logic levels. For example, a signal having a logic high level may be set to have a logic low level according to an embodiment, and a signal having a logic low level may be set to have a logic high level according to an embodiment.

Hereafter, the present disclosure will be described in more detail through embodiments. The embodiments are only used to exemplify the present disclosure, and the scope of the present disclosure is not limited by the embodiments.

Figure 1:
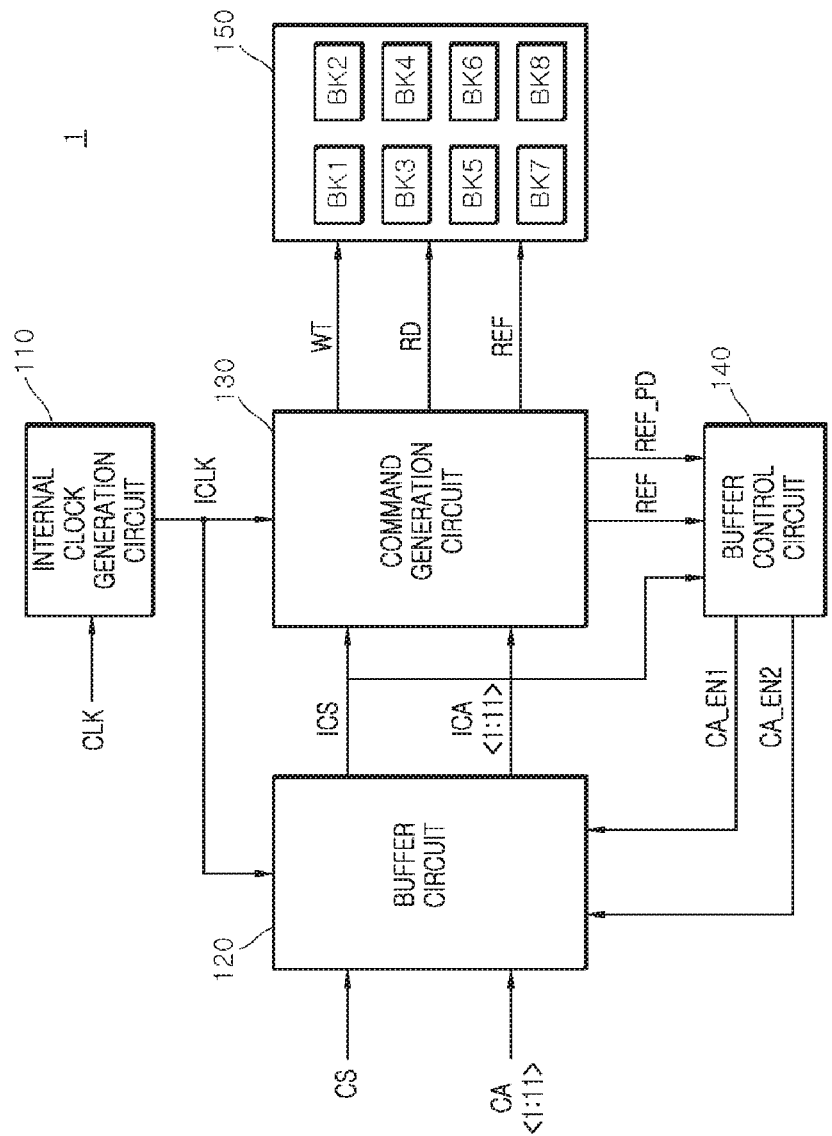
FIG. 1 is a block diagram illustrating a configuration of an electronic device in accordance with an embodiment.

As illustrated in FIG. 1, an electronic device 1 in accordance with an embodiment may include an internal clock generation circuit 110, a buffer circuit 120, a command generation circuit 130, a buffer control circuit 140, and a core circuit 150.

The internal clock generation circuit 110 may receive a clock CLK and generate an internal clock ICLK. The internal clock generation circuit 110 may generate the internal clock ICLK by adjusting the phase of the clock CLK. The internal clock generation circuit 110 may generate the internal clock ICLK by dividing the frequency of the clock CLK. The internal clock generation circuit 110 may generate the internal clock ICLK having a frequency corresponding to ½ of the frequency of the clock CLK. The clock CLK may be set to a signal which periodically toggles to control the operation of the electronic device 1 in accordance with the present embodiment. The operation of the internal clock generation circuit 110 to generate the internal clock ICLK by dividing the frequency of the clock CLK will be described in detail with reference to FIG. 2 which will be described below.

The buffer circuit 120 may generate an internal chip selection signal ICS and first to 11th internal command addresses ICA<1:11> from a chip selection signal CS and first to 11th command addresses CA<1:11>. The buffer circuit 120 may generate the internal chip selection signal ICS by buffering the chip selection signal CS. The buffer circuit 120 may include a first group of buffers and a second group of buffers, which are enabled by a first buffer enable signal CA_EN1 and a second buffer enable signal CA_EN2. The buffer circuit 120 may generate a first group of internal command addresses ICA<1, 3, 4, 6:11> through the first group of buffers which are enabled. The buffer circuit 120 may generate a second group of internal command addresses ICA<2,5> through the second group of buffers which are enabled. The first group of buffers and the second group of buffers will be described in detail with reference to FIGS. 4, 6, and 11. According to an embodiment, the first group of internal command addresses ICA<1,3,4,6:11> and the second group of internal command addresses ICA<2,5> may be set to combinations of various bits among the first to 11th internal command addresses ICA<1:11>.

The command generation circuit 130 may generate a refresh command REF and a driving control signal REF_PD according to a logic level combination of the internal chip selection signal ICS and the first and second groups of internal command addresses ICA<1:11> during a refresh operation. The command generation circuit 130 may generate a first internal command WT and a second internal command RD by detecting a logic level combination of the internal chip selection signal ICS and the second group of internal command addresses ICA<2,5> during the refresh operation.

The buffer control circuit 140 may generate the first buffer enable signal CA_EN1 for enabling the first group of buffers and the second buffer enable signal CA_EN2 for enabling the second group of buffers, from the refresh command REF and the driving control signal REF_PD.

The core circuit 150 may include first to eight banks BK1 to BK8. The core circuit 150 may perform the all-bank refresh operation and the same-bank refresh operation according to the refresh command REF. The core circuit 150 may refresh the first to eighth banks BK1 to BK8 during the all-bank refresh operation according to the refresh command REF. The core circuit 150 may refresh any one of the first to eighth banks BK1 to BK8 during the same-bank refresh operation according to the refresh command REF. The core circuit 150 may perform a first internal operation according to the first internal command WT. The core circuit 150 may perform a second internal operation according to the second internal command RD. The first internal operation may be set to a write operation of storing data by compensating for the resistance value of an input/output line to/from which the data are inputted/outputted. The second internal operation may be set to a read operation of outputting data by compensating for the resistance value of an input/output line to/from which the data are inputted/outputted.

Figure 2:
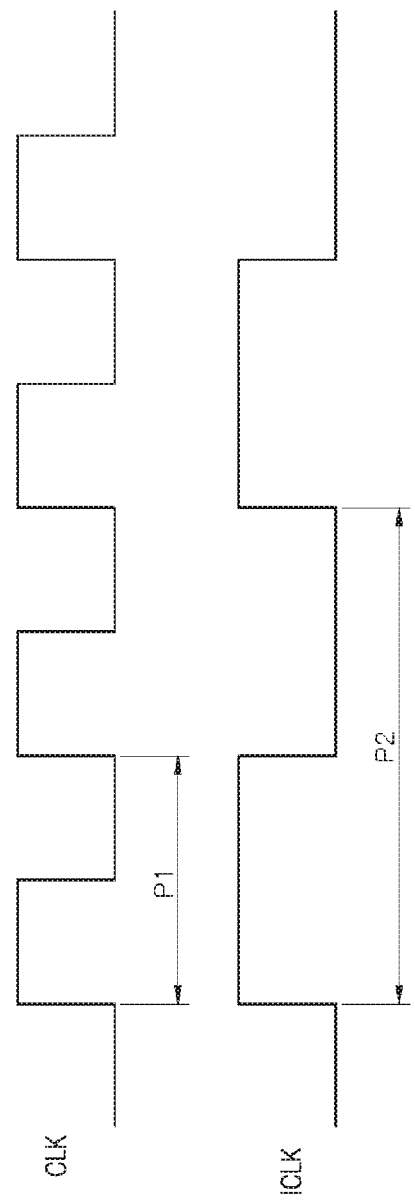
FIG. 2 is a diagram for describing an operation of an internal clock generation circuit included in the electronic device illustrated in FIG. 1.

Referring to FIG. 2, the operation of the internal clock generation circuit 110 will be described as follows.

The internal clock generation circuit 110 may generate the internal clock ICLK by dividing the frequency of the clock CLK. One period P2 of the internal clock ICLK may be set to a period twice longer than one period P1 of the clock CLK. The frequency of the internal clock ICLK may be set to a frequency corresponding to ½ of the frequency of the clock CLK.

Referring to FIG. 3, the logic level combinations of the internal chip selection signal ICS and the first to 11th internal command addresses ICA<1:11> for performing the refresh operation and the first and second internal operations in accordance with the present embodiment will be described as follows.

First, a logic level combination of the internal chip selection signal ICS and the first to 11th internal command addresses ICA<1:11> for performing the all-bank refresh operation REFRESH ALL BANK during the refresh operation will be described as follows.

In order to perform the all-bank refresh operation REFRESH ALL BANK during the refresh operation, the internal chip selection signal ICS may be set to a logic low level L, the first internal command address ICA<1> may be set to a logic high level H, the second internal command address ICA<2> may be set to a logic high level H, the third internal command address ICA<3> may be set to a logic low level L, the fourth internal command address ICA<4> may be set to a logic low level L, the fifth internal command address ICA<5> may be set to a logic high level H, and the 11th internal command address ICA<11> may be set to a logic low level L. The sixth to tenth internal command addresses ICA<6:10> may be set to various pieces of information such as an address for setting an operation of the electronic device 1. The 11th internal command address ICA<11> may be set to an all-bank information signal for setting all-bank refresh during the refresh operation.

Next, a logic level combination of the internal chip selection signal ICS and the first to 11th internal command addresses ICA<1:11> for performing the same-bank refresh operation REFRESH SAME BANK during the refresh operation will be described as follows.

In order to perform the same-bank refresh operation REFRESH SAME BANK during the refresh operation, the internal chip selection signal ICS may be set to a logic low level L, the first internal command address ICA<1> may be set to a logic high level H, the second internal command address ICA<2> may be set to a logic high level H, the third internal command address ICA<3> may be set to a logic low level L, the fourth internal command address ICA<4> may be set to a logic low level L, the fifth internal command address ICA<5> may be set to a logic high level H, and the 11th internal command address ICA<11> may be set to a logic high level H. The sixth to tenth internal command addresses ICA<6:10> may be set to various pieces of information such as an address for setting an operation of the electronic device 1.

The all-bank information signal inputted through the 11th internal command address ICA<11> to perform the all-bank refresh operation during the refresh operation may be set to a logic low level. The all-bank information signal inputted through the 11th internal command address ICA<11> to perform the same-bank refresh operation during the refresh operation may be set to a logic high level.

Next, a logic level combination of the internal chip selection signal ICS and the second group of internal command addresses ICA<2,5> for performing a first internal operation WRITE during the refresh operation will be described as follows.

In order to perform the first internal operation WRITE during the refresh operation, the internal chip selection signal ICS may be set to a logic low level L, the second internal command address ICA<2> may be set to a logic low level L, and the fifth internal command address ICA<5> may be set to a logic low level L.

Next, a logic level combination of the internal chip selection signal ICS and the first and second groups of internal command addresses ICA<1:11> for performing the first internal operation WRITE during a normal operation will be described as follows.

In order to perform the first internal operation WRITE during the normal operation, the internal chip selection signal ICS may be set to a logic low level L, the first internal command address ICA<1> may be set to a logic high level H, the second internal command address ICA<2> may be set to a logic low level L, the third internal command address ICA<3> may be set to a logic high level H, the fourth internal command address ICA<4> may be set to a logic high level H, and the fifth internal command address ICA<5> may be set to a logic low level L. The sixth to 11th internal command addresses ICA<6:11> may be set to various pieces of information such as an address for setting a write operation of the electronic device 1.

Next, a logic level combination of the internal chip selection signal ICS and the second group of internal command addresses ICA<2,5> for performing a second internal operation READ will be described as follows.

In order to perform the second internal operation READ during the refresh operation, the internal chip selection signal ICS may be set to a logic low level L, the second internal command address ICA<2> may be set to a logic low level L, and the fifth internal command address ICA<5> may be set to a logic high level H.

Next, a logic level combination of the internal chip selection signal ICS and the first and second groups of internal command addresses ICA<1:11> for performing the second internal operation READ during the normal operation will be described as follows.

In order to perform the second internal operation READ during the normal operation, the internal chip selection signal ICS may be set to a logic low level L, the first internal command address ICA<1> may be set to a logic high level H, the second internal command address ICA<2> may be set to a logic low level L, the third internal command address ICA<3> may be set to a logic high level H, the fourth internal command address ICA<4> may be set to a logic high level H, and the fifth internal command address ICA<5> may be set to a logic high level H. The sixth to 11th internal command addresses ICA<6:11> may be set to various pieces of information such as an address for setting a read operation of the electronic device 1.

Figure 4:
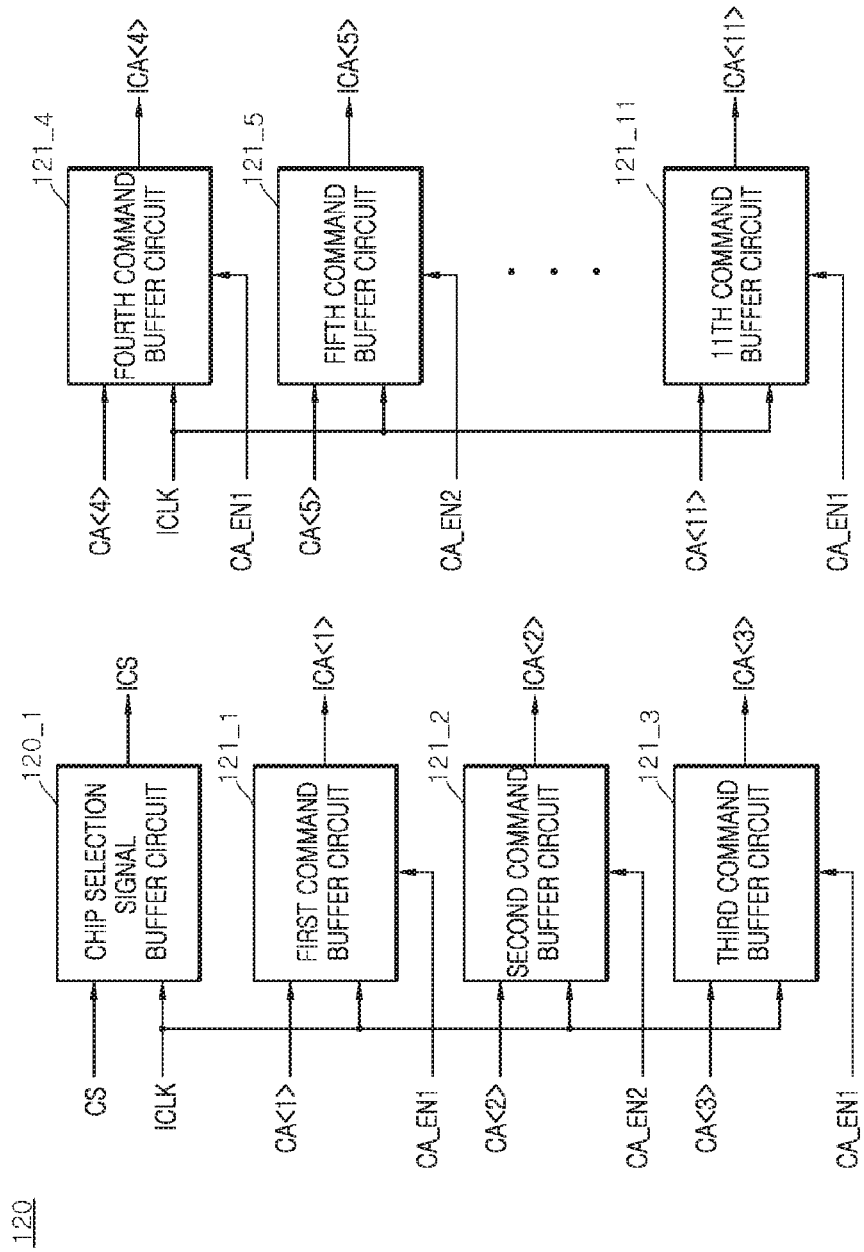
FIG. 4 is a block diagram illustrating a configuration of a buffer circuit included in the electronic device illustrated in FIG. 1.

Referring to FIG. 4, the buffer circuit 120 in accordance with the present embodiment may include a chip selection signal buffer circuit 120_1 and first to 11th command buffer circuits 121_1 to 121_11.

The chip selection signal buffer circuit 120_1 may generate the internal chip selection signal ICS by buffering the chip selection signal CS in synchronization with a rising edge of the internal clock ICLK.

When the first buffer enable signal CA_EN1 is enabled, the first command buffer circuit 121_1 may generate the first internal command addresses ICA<1> by buffering the first command address CA<1> in synchronization with a rising edge of the internal clock ICLK. When the first buffer enable signal CA_EN1 is disabled, the first command buffer circuit 121_1 may block the generation of the first internal command address ICA<1>.

When the second buffer enable signal CA_EN2 is enabled, the second command buffer circuit 1212 may generate the second internal command addresses ICA<2> by buffering the second command address CA<2> in synchronization with a rising edge of the internal clock ICLK. When the second buffer enable signal CA_EN2 is disabled, the second command buffer circuit 121_2 may block the generation of the second internal command address ICA<2>.

Because the third and fourth command buffer circuits 121_3 and 121_4 and the sixth to 11th command buffer circuits 121_6 to 121_11 perform the same operation as the first command buffer circuit 121_1 except that input and output signals thereof are different from those of the first command buffer circuit 121_1, the detailed descriptions thereof will be omitted herein. Because the fifth command buffer circuit 121_5 performs the same operation as the second command buffer circuit 121_2 except that input and output signals thereof are different from those of the second command buffer circuit 121_2, the detailed descriptions thereof will be omitted herein.

Figure 5:
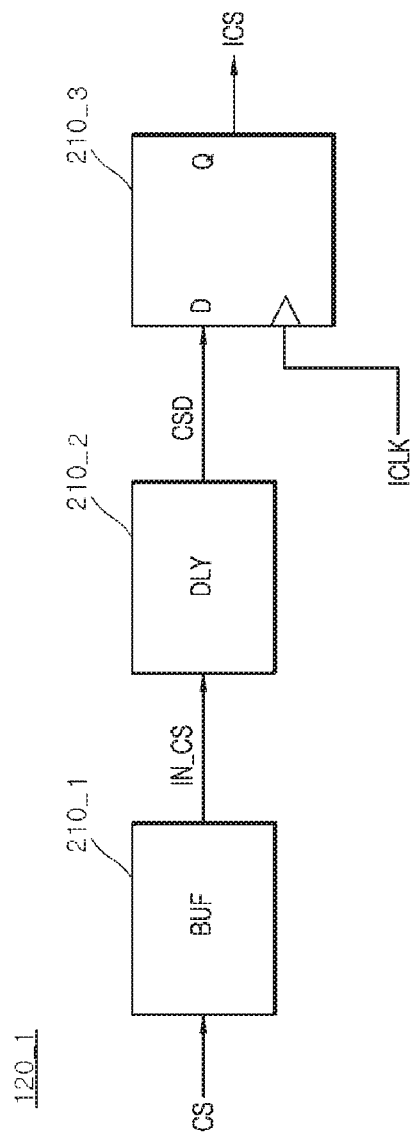
FIG. 5 is a diagram illustrating a configuration of a chip selection signal buffer circuit included in the buffer circuit illustrated in FIG. 4.

Referring to FIG. 5, the chip selection signal buffer circuit 120_1 may include a first buffer 210_1, a first delay circuit 210_2, and a first transfer circuit 210_3.

The first buffer 210_1 may generate an input chip selection signal IN_CS by buffering the chip selection signal CS.

The first delay circuit 210_2 may generate a delayed chip selection signal CSD by delaying the input chip selection signal IN_CS.

The first transfer circuit 2103 may receive the delayed chip selection signal CSD and generate the internal chip selection signal ICS, in synchronization with a rising edge of the internal clock ICLK.

Figure 6:
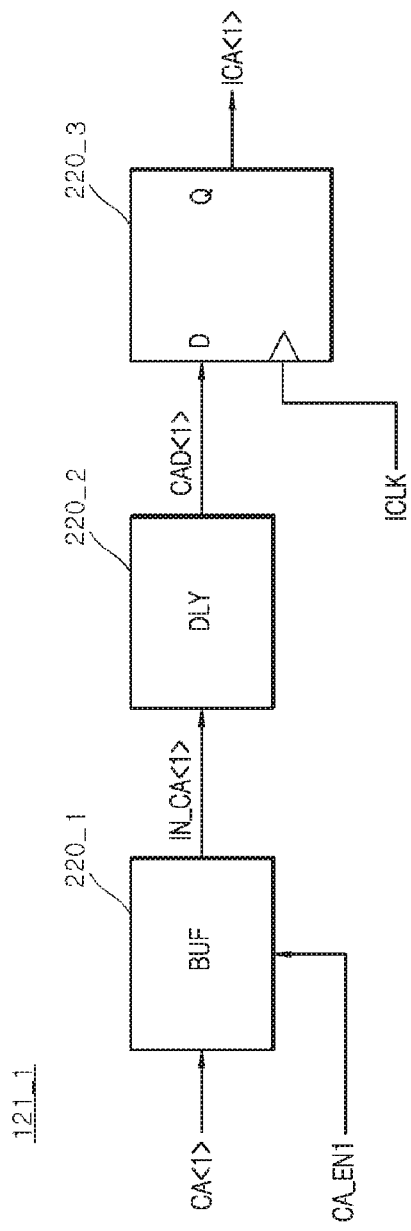
FIG. 6 is a diagram illustrating a configuration of a first command buffer circuit included in the buffer circuit illustrated in FIG. 4.

Referring to FIG. 6, the first command buffer circuit 121_1 may include a second buffer 220_1, a second delay circuit 220_2, and a second transfer circuit 220_3.

When the second buffer 220_1 is enabled by the first buffer enable signal CA_EN1, the second buffer 220_1 may generate a first input command address IN_CA<1> by buffering the first command address CA<1>. When the second buffer 220_1 is disabled by the first buffer enable signal CA_EN1, the second buffer 2201 may block the generation of the first input command address IN_CA<1>.

The second delay circuit 220_2 may generate a first delayed command address CAD<1> by delaying the first input command address IN_CA<1>.

The second transfer circuit 220_3 may receive the first delayed command address CAD<1> and generate the first internal command address ICA<1>, in synchronization with a rising edge of the internal clock ICLK.

Figure 7:
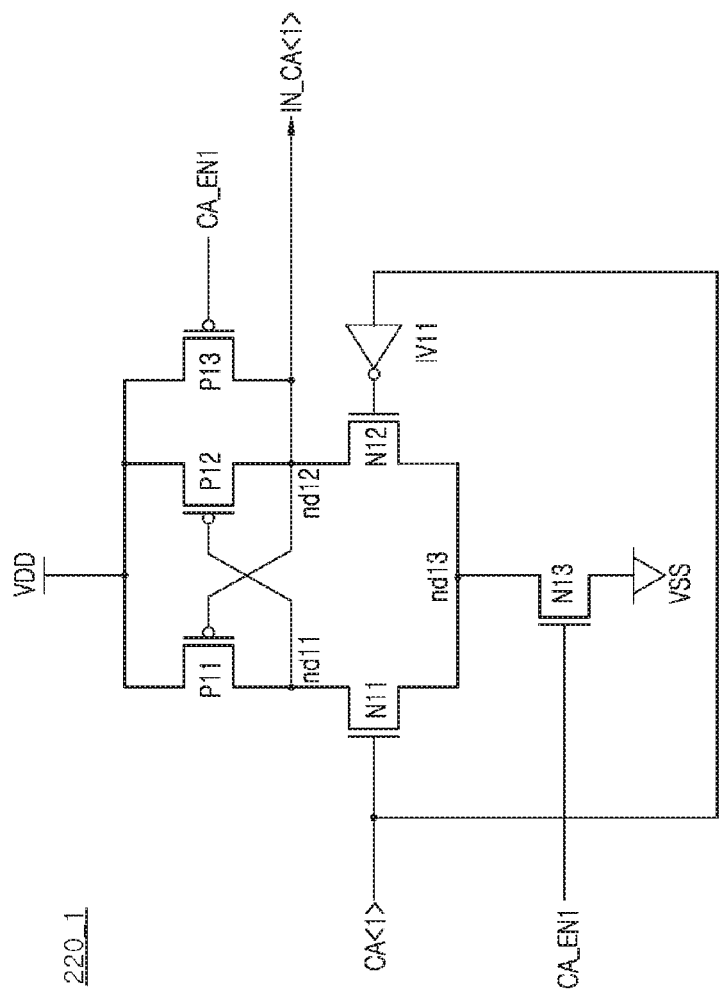
FIG. 7 is a circuit diagram illustrating a configuration of a second buffer included in the first command buffer circuit illustrated in FIG. 6.

Referring to FIG. 7, the second buffer 220_1 may be implemented as a PMOS transistor P11 coupled between a supply voltage VDD and a first node nd11, PMOS transistors P12 and P13 coupled between the supply voltage VDD and a second node nd12, an NMOS transistor N11 coupled between the first node nd11 and a third node nd13, an NMOS transistor N12 coupled between the second node nd12 and the third node nd13, an NMOS transistor N13 coupled between the third node nd13 and a ground voltage VSS, and an inverter IV11.

When the first buffer enable signal CA_EN1 is enabled to a logic high level, the second buffer 220_1 may generate the first input command address IN_CA<1> which is driven according to the logic level of the first command address CA<1>.

When the first buffer enable signal CA_EN1 is disabled to a logic low level, the second buffer 220_1 may block the generation of the first input command address IN_CA<1>.

Figure 8:
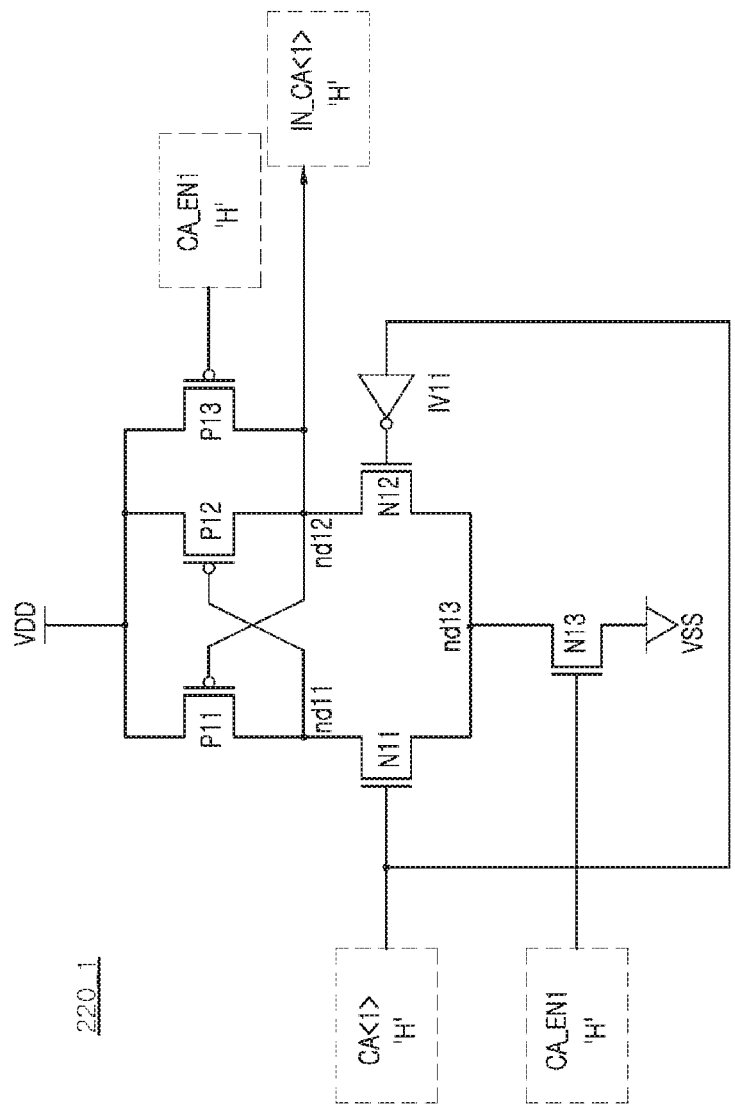
FIGS. 8, 9, and 10 are diagrams for describing an operation of the second buffer illustrated in FIG. 7.

Referring to FIG. 8, the operation of the second buffer 220_1 when the first buffer enable signal CA_EN1 is enabled to a logic high level and the first command address CA<1> is inputted at a logic high level will be described as follows.

When the first buffer enable signal CA_EN1 is enabled to a logic high level and the first command address CA<1> is inputted at a logic high level, the NMOS transistors N11 and N13 of the second buffer 220_1 are turned on to drive the first node nd11 at the level of the ground voltage VSS.

When the first node nd11 is driven at the level of the ground voltage VSS, the PMOS transistor P12 of the second buffer 220_1 may be turned on to drive the second node nd12 at the level of the supply voltage VDD. As the second node nd12 is driven at the level of the supply voltage VDD, the second buffer 220_1 generates the first input command address IN_CA<1> at a logic high level.

Figure 9:
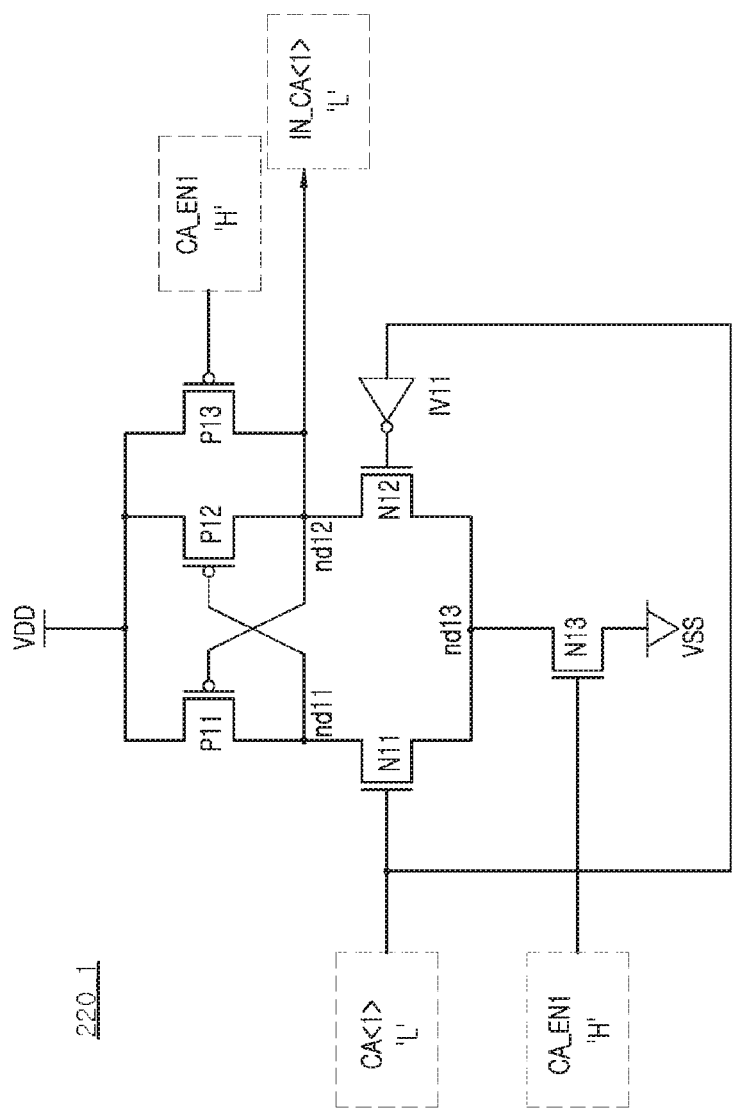

Referring to FIG. 9, the operation of the second buffer 220_1 when the first buffer enable signal CA_EN1 is enabled to a logic high level and the first command address CA<1> is inputted at a logic low level will be described as follows.

When the first buffer enable signal CA_EN1 is enabled to a logic high level and the first command address CA<1> is inputted at a logic low level, the NMOS transistors N12 and N13 of the second buffer 220_1 are turned on to drive the second node nd12 at the level of the ground voltage VSS. As the second node nd12 is driven at the level of the ground voltage VSS, the second buffer 220_1 generates the first input command address IN_CA<1> at a logic low level.

Figure 10:
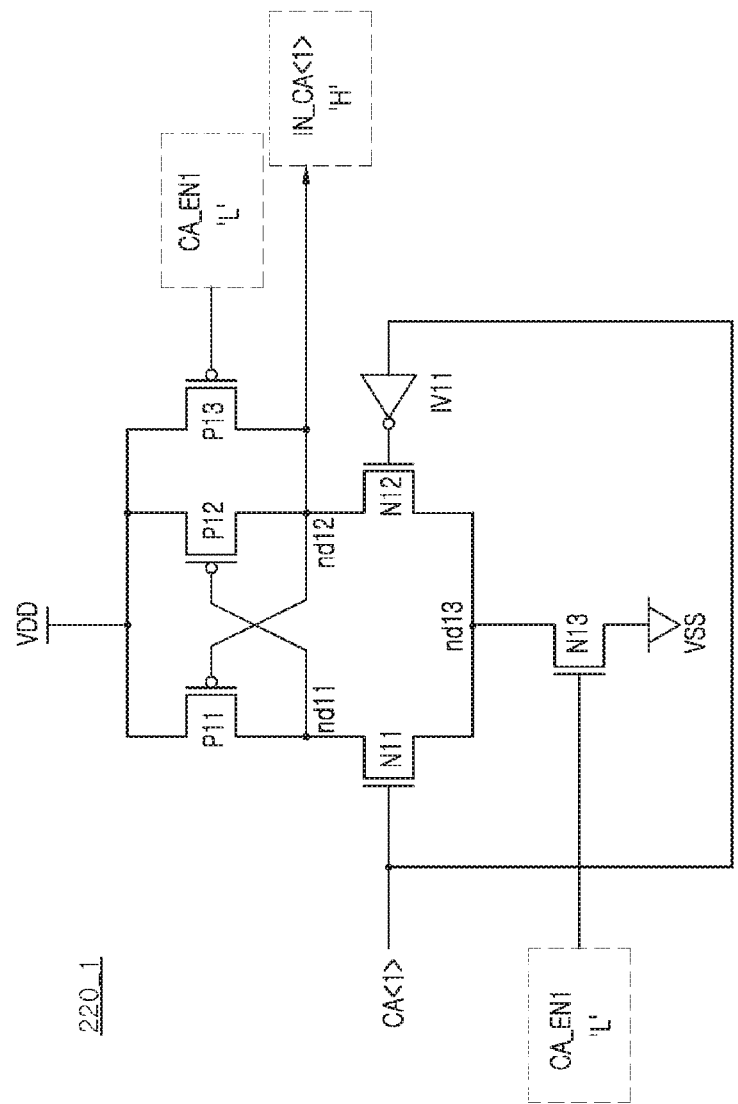

Referring to FIG. 10, the operation of the second buffer 220_1 when the first buffer enable signal CA_EN1 is disabled to a logic low level will be described as follows.

When the first buffer enable signal CA_EN1 is disabled to a logic low level, the PMOS transistor P13 of the second buffer 220_1 is turned on to drive the second node nd12 at the level of the supply voltage VDD. As the second node nd12 is driven at the level of the supply voltage VDD, the second buffer 2201 generates the first input command address IN_CA<1> at a logic high level.

At this time, when the first buffer enable signal CA_EN1 is disabled to a logic low level, the second buffer 220_1 may block the generation of the first input command address IN_CA<1> by generating the first input command address IN_CA<1> clamped to a logic high level, regardless of the logic level of the first command address CA<1>.

Figure 11:
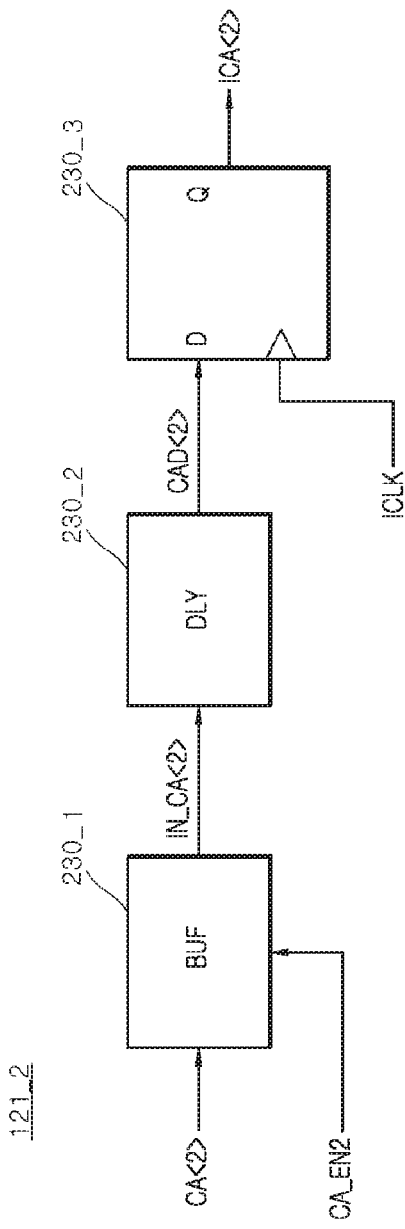
FIG. 11 is a diagram illustrating a configuration of a second command buffer circuit included in the buffer circuit illustrated in FIG. 4.

Referring to FIG. 11, the second command buffer circuit 121_2 may include a third buffer 230_1, a third delay circuit 230_2, and a third transfer circuit 230_3.

When the third buffer 230_1 is enabled by the second buffer enable signal CA_EN2, the third buffer 230_1 may generate a second input command address IN_CA<2> by buffering the second command address CA<2>. When the third buffer 230_1 is disabled by the second buffer enable signal CA_EN2, the third buffer 2301 may block the generation of the second input command address IN_CA<2>.

The third delay circuit 2302 may generate a second delayed command address CAD<2> by delaying the second input command address IN_CA<2>.

The third transfer circuit 230_3 may receive the second delayed command address CAD<2> and generate the second internal command address ICA<2>, in synchronization with a rising edge of the internal clock ICLK.

Figure 12:
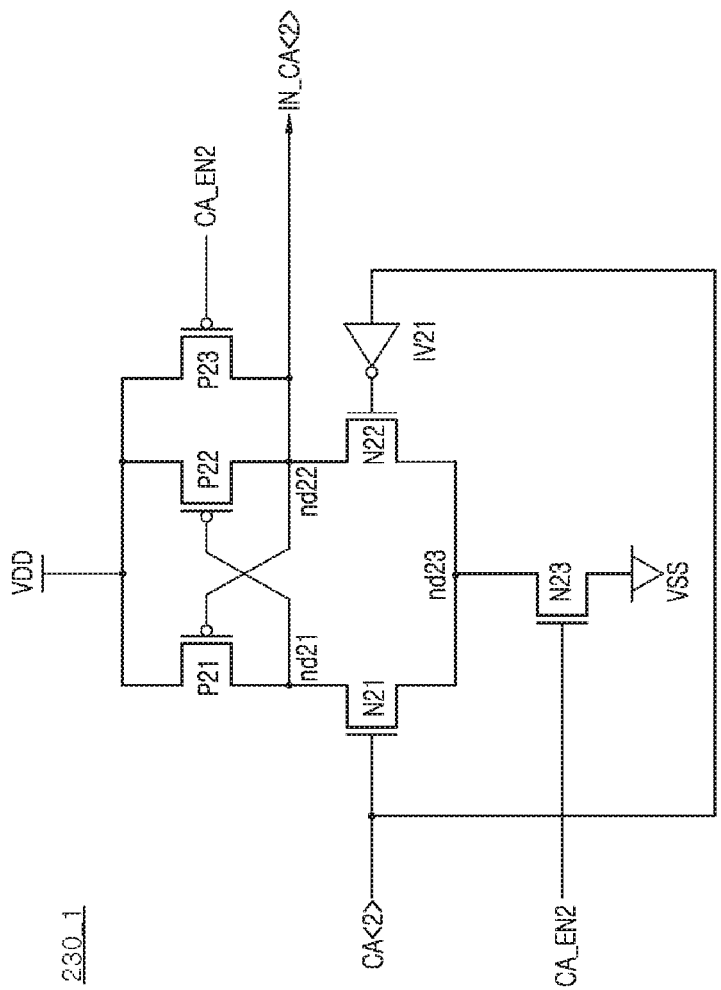
FIG. 12 is a circuit diagram illustrating a configuration of a third buffer included in the second command buffer circuit illustrated in FIG. 11.

Referring to FIG. 12, the third buffer 230_1 may be implemented as a PMOS transistor P21 coupled between the supply voltage VDD and a fourth node nd21, PMOS transistors P22 and P23 coupled between the supply voltage VDD and a fifth node nd22, an NMOS transistor N21 coupled between the fourth node nd21 and a sixth node nd23, an NMOS transistor N22 coupled between the fifth node nd22 and the sixth node nd23, an NMOS transistor N23 coupled between the sixth node nd23 and the ground voltage VSS, and an inverter IV21.

When the second buffer enable signal CA_EN2 is enabled to a logic high level, the third buffer 230_1 may generate the second input command address IN_CA<2> which is driven according to the logic level of the second command address CA<2>.

The third buffer 230_1 may block the generation of the second input command address IN_CA<2> when the second buffer enable signal CA_EN2 is disabled to a logic low level.

Because the third buffer 230_1 is implemented as the same circuit as the second buffer 220_1 described with reference to FIGS. 7 to 10 and performs the same operation as the second buffer 220_1 except that input and output signals thereof are different from those of the second buffer 220_1, the detailed descriptions of the operation thereof will be omitted herein.

Figure 13:
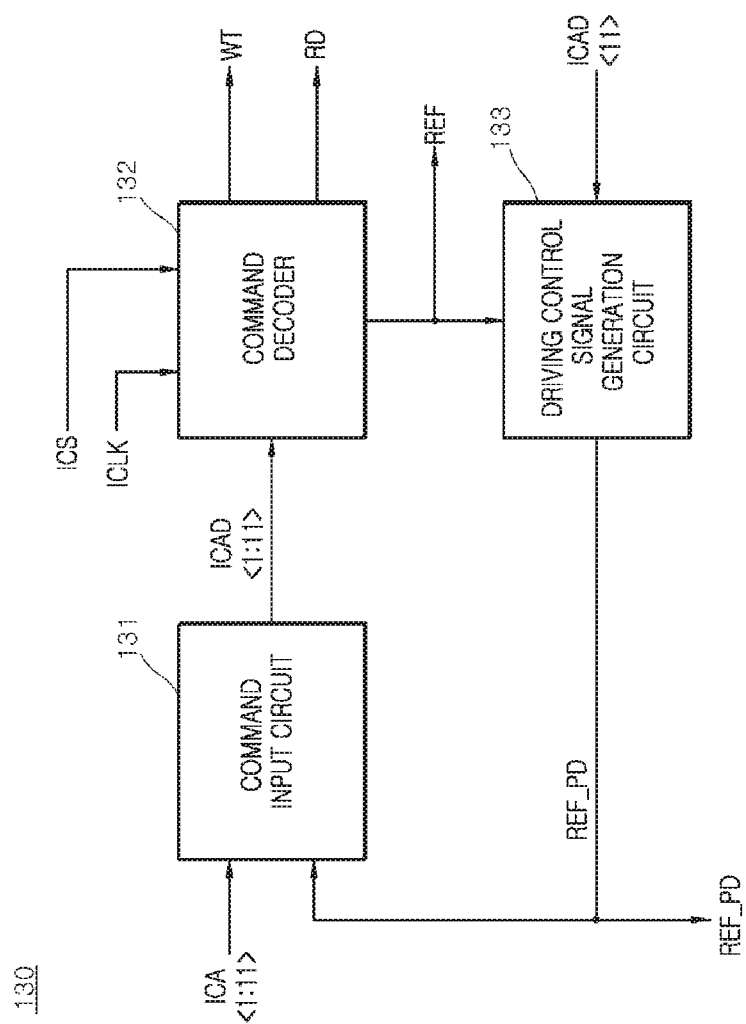
FIG. 13 is a block diagram illustrating a configuration of a command generation circuit included in the electronic device illustrated in FIG. 1.

Referring to FIG. 13, the command generation circuit 130 may include a command input circuit 131, a command decoder 132, and a driving control signal generation circuit 133.

The command input circuit 131 may generate first to 11th input commands ICAD<1:11> from the first to 11th internal command addresses ICA<1:11> according to the driving control signal REF_PD. The command input circuit 131 may block an input of some of the first to 11th internal command addresses ICA<1:11> according to the driving control signal REF_PD.

The command decoder 132 may generate the refresh command REF, the first internal command WT and the second internal command RD by decoding the internal chip selection signal ICS and the first to 11th input commands ICAD<1:11> in synchronization with the internal clock ICLK. The command decoder 132 may generate the refresh command REF, the first internal command WT, and the second internal command RD which are selectively enabled according to the logic level combination of the internal chip selection signal ICS and the first to 11th input commands ICAD<1:11> in synchronization with the internal clock ICLK.

The logic level combination of the internal chip selection signal ICS and the first to 11th input commands ICAD<1:11> for generating the refresh command REF may be set to the same logic level combination as the logic level combination of the internal chip selection signal ICS and the first to 11th internal command addresses ICA<1:11> which are inputted during the all-bank refresh operation and the same-bank refresh operation which have been described with reference to FIG. 3. The logic level combination of the internal chip selection signal ICS and the first to 11th input commands ICAD<1:11> for generating the first internal command WT may be set to the same logic level combination as the logic level combination of the internal chip selection signal ICS and the first to 11th internal command addresses ICA<1:11> which are inputted during the first internal operation described with reference to FIG. 3. The logic level combination of the internal chip selection signal ICS and the first to 11th input commands ICAD<1:11> for generating the second internal command RD may be set to the same logic level combination as the logic level combination of the internal chip selection signal ICS and the first to 11th internal command addresses ICA<1:11> which are inputted during the second internal operation described with reference to FIG. 3.

The driving control signal generation circuit 133 may generate the driving control signal REF_PD which is enabled in a predetermined period during the all-bank refresh operation of the refresh operation. The driving control signal generation circuit 133 may generate the driving control signal REF_PD which is enabled in a predetermined period by the all-bank information signal and the refresh command REF which are inputted through the 11th input command address ICAD<11>.

Figure 14:
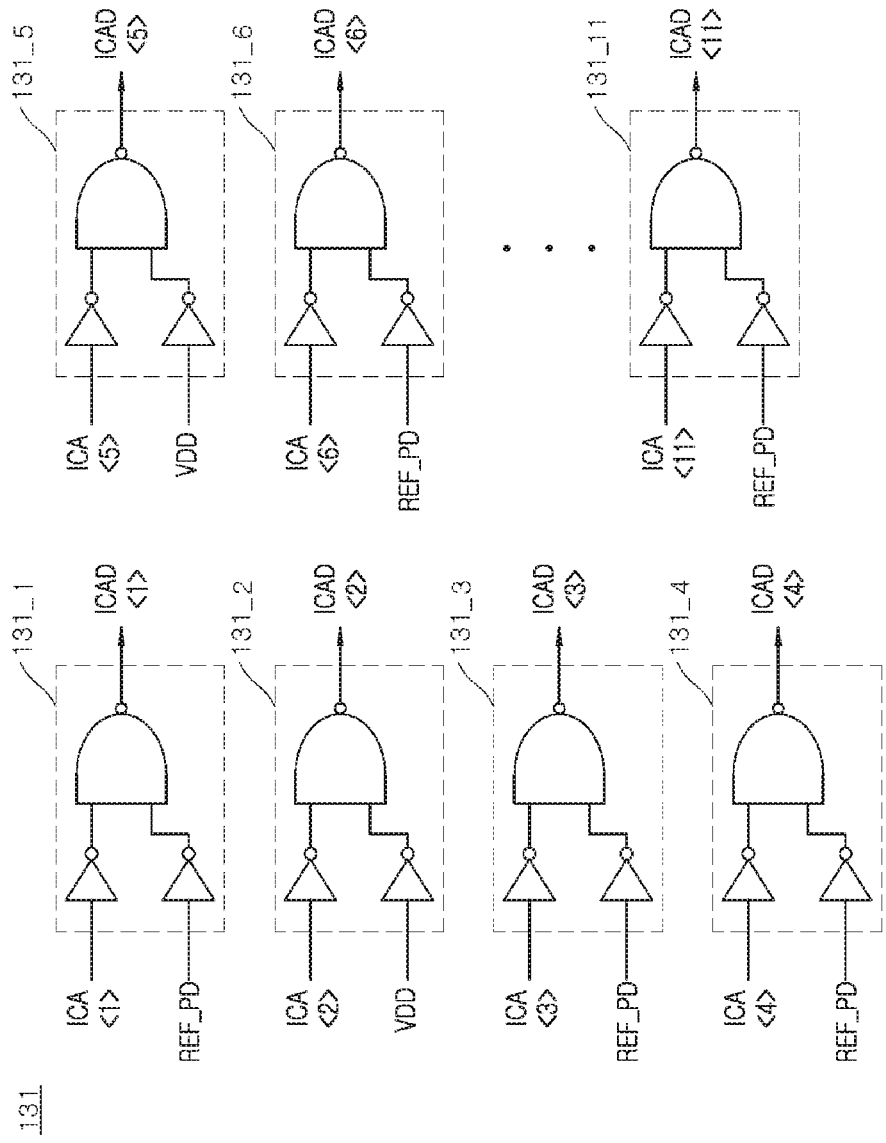
FIG. 14 is a circuit diagram illustrating a configuration of a command input circuit included in the command generation circuit illustrated in FIG. 13.

Referring to FIG. 14, the command input circuit 131 may include first to 11th command input circuits 131_1 to 131_11.

The first command input circuit 1311 may generate the first input command ICAD<1> from the first internal command address ICA<1> according to the logic level of the driving control signal REF_PD. The first command input circuit 131_1 may generate the first input command ICAD<1> by buffering the first internal command address ICA<1>, when the driving control signal REF_PD is inputted at a logic low level. The first command input circuit 131_1 may block the input of the first internal command address ICA<1>, when the driving control signal REF_PD is inputted at a logic high level.

The second command input circuit 1312 may generate the second input command ICAD<2> from the second internal command address ICA<2> using the supply voltage VDD. The second command input circuit 131_2 may generate the second input command ICAD<2> by buffering the second internal command address ICA<2>.

Because the third and fourth command input circuits 1313 and 131_4 and the sixth to 11th command input circuits 131_6 to 131_11 are implemented as the same circuits as the first command input circuit 131_1 and perform the same operation as the first command input circuit 131_1 except that input and output signals thereof are different from those of the first command input circuit 131_1, the detailed descriptions thereof will be omitted herein. Because the fifth command input circuit 131_5 is implemented as the same circuit as the second command input circuit 131_2 and performs the same operation as the second command input circuit 131_2 except that input and output signals thereof are different from those of the second command input circuit 131_2, the detailed descriptions thereof will be omitted herein.

Figure 15:
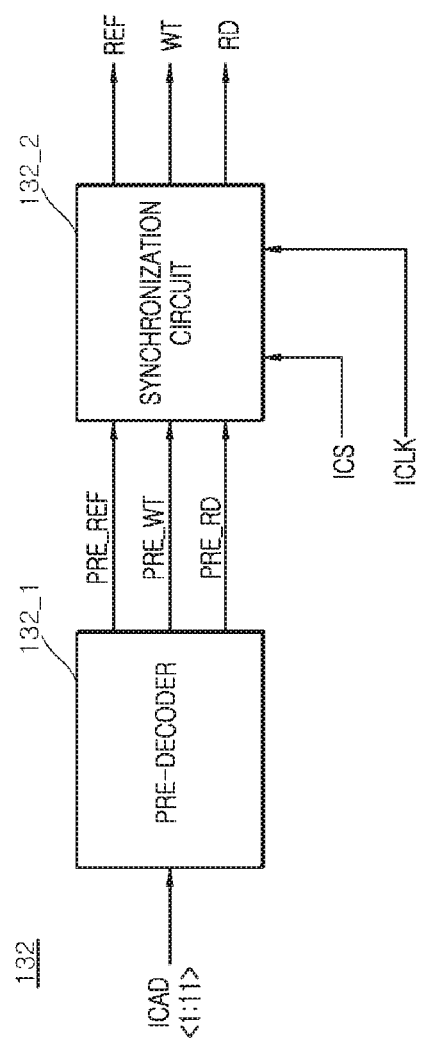
FIG. 15 is a block diagram illustrating a configuration of a command decoder included in the command generation circuit illustrated in FIG. 13.

Referring to FIG. 15, the command decoder 132 may include a pre-decoder 132_1 and a synchronization circuit 132_2.

The pre-decoder 132_1 may generate a pre-refresh command PRE_REF, a first pre-internal command PRE_WT, and a second pre-internal command PRE_RD by decoding the first to 11th input commands ICAD<1:11>. The pre-decoder 132_1 may generate the pre-refresh command PRE_ REF, the first pre-internal command PRE_WT, and the second pre-internal command PRE_RD, which are selectively enabled according to the logic level combination of the first to 11th input commands ICAD<1:11>.

The synchronization circuit 1322 may generate the refresh command REF, the first internal command WT, and the second internal command RD from the internal chip selection signal ICS, the pre-refresh command PRE_REF, the first pre-internal command PRE_WT, and the second pre-internal command PRE_RD in synchronization with the internal clock ICLK. The synchronization circuit 132_2 may generate the refresh command REF, the first internal command WT, and the second internal command RD from the pre-refresh command PRE_REF, the first pre-internal command PRE_WT, and the second pre-internal command PRE_RD during a period in which the internal chip selection signal ICS is at a logic low level, in synchronization with the internal clock ICLK.

Figure 16:
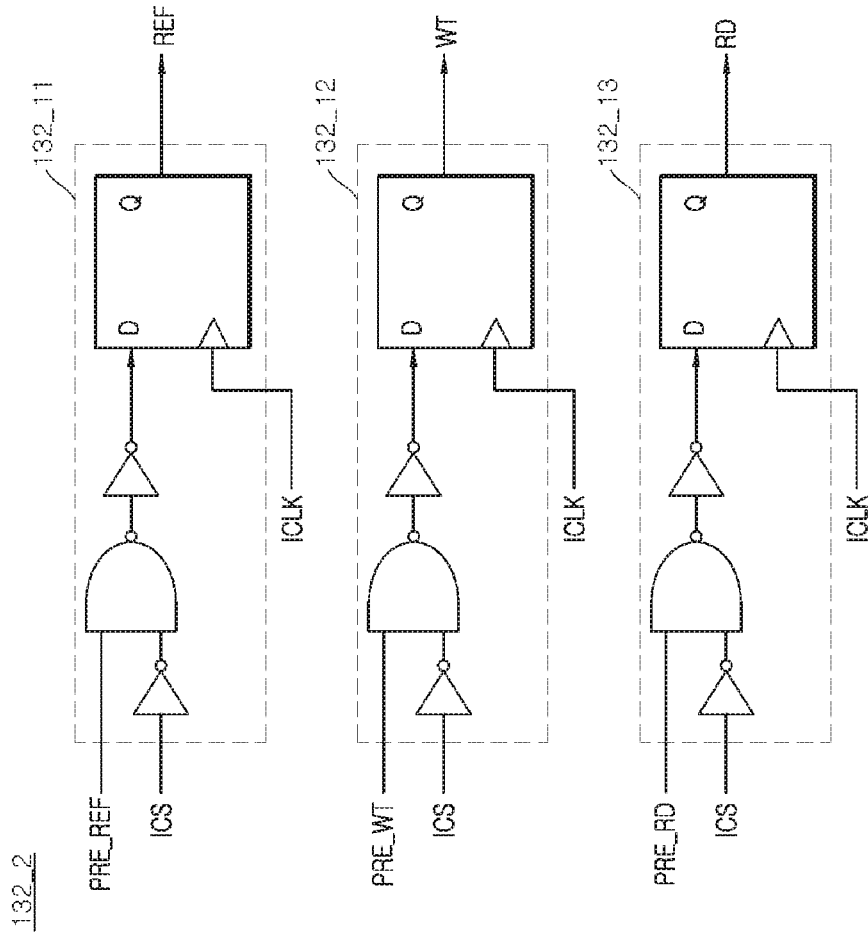
FIG. 16 is a circuit diagram illustrating a configuration of a synchronization circuit included in the command decoder illustrated in FIG. 15.

Referring to FIG. 16, the synchronization circuit 132_2 may include a first synchronization circuit 132_11, a second synchronization circuit 132_12, and a third synchronization circuit 132_13.

The first synchronization circuit 132_11 may generate the refresh command REF from the pre-refresh command PRE_REF in synchronization with a rising edge of the internal clock ICLK when the internal chip selection signal ICS is inputted at a logic low level. The first synchronization circuit 132_11 may buffer the pre-refresh command PRE_REF and output the buffered signal as the refresh command REF in synchronization with a rising edge of the internal clock ICLK, when the internal chip selection signal ICS is inputted at a logic low level.

The second synchronization circuit 132_12 may generate the first internal command WT from the first pre-internal command PRE_WT in synchronization with a rising edge of the internal clock ICLK when the internal chip selection signal ICS is inputted at a logic low level. The second synchronization circuit 132_12 may buffer the first pre-internal command PRE_WT and output the buffered signal as the first internal command WT in synchronization with a rising edge of the internal clock ICLK, when the internal chip selection signal ICS is inputted at a logic low level.

The third synchronization circuit 132_13 may generate the second internal command RD from the second pre-internal command PRE_RD in synchronization with a rising edge of the internal clock ICLK when the internal chip selection signal ICS is inputted at a logic low level. The third synchronization circuit 13213 may buffer the second pre-internal command PRE_RD and output the buffered signal as the second internal command RD in synchronization with a rising edge of the internal clock ICLK, when the internal chip selection signal ICS is inputted at a logic low level.

Figure 17:
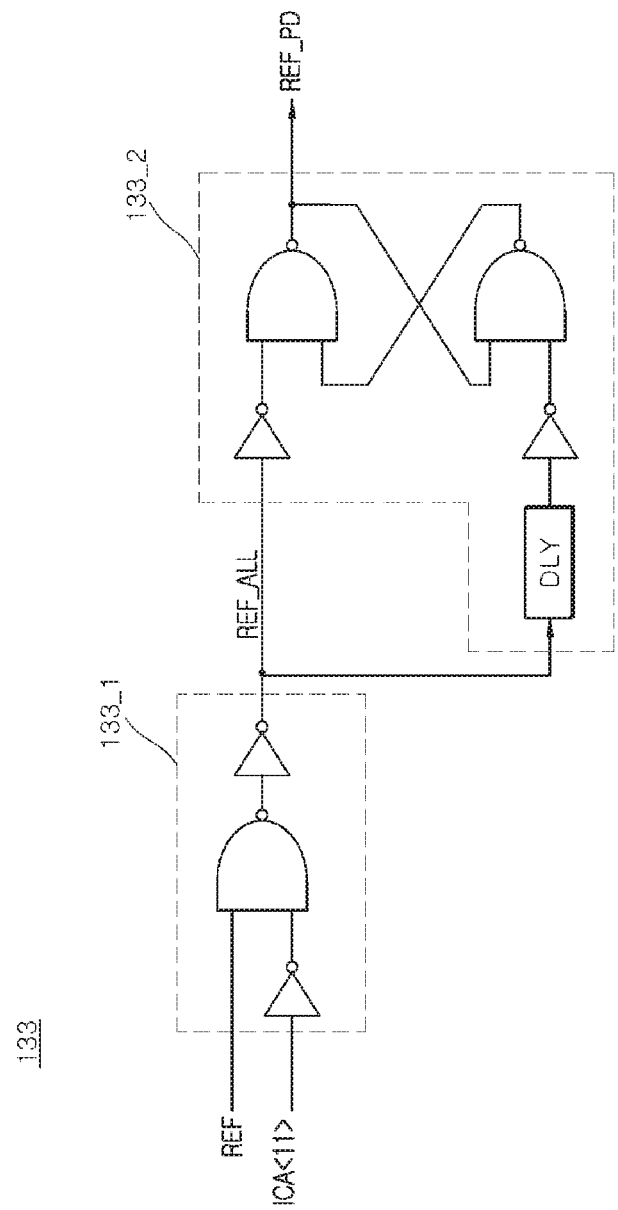
FIG. 17 is a circuit diagram illustrating a configuration of a driving control signal generation circuit included in the command generation circuit illustrated in FIG. 13.

Referring to FIG. 17, the driving control signal generation circuit 133 may include an all-bank refresh signal generation circuit 133_1 and a latch circuit 133_2.

The all-bank refresh signal generation circuit 133_1 may generate an all-bank refresh signal REF_ALL from the all-bank information signal inputted from the 11th internal command address ICA<11> during a period in which the refresh command REF is inputted. The all-bank refresh signal generation circuit 133_1 may generate the all-bank refresh signal REF_ALL which is enabled when the 11th internal command address ICA<11> is at a logic low level during the period in which the refresh command REF is inputted. The all-bank refresh signal generation circuit 133_1 may generate the all-bank refresh signal REF_ALL which is disabled when the 11th internal command address ICA<11> is at a logic high level during the period in which the refresh command REF is inputted. The all-bank refresh signal REF_ALL may be enabled when the all-bank refresh operation is performed during the refresh operation. The all-bank refresh signal REF_ALL may be disabled when the same-bank refresh operation is performed during the refresh operation.

The latch circuit 133_2 may generate the driving control signal REF_PD which is enabled by the all-bank refresh signal REF_ALL, and disabled after a predetermined period. The latch circuit 133_2 may generate the driving control signal REF_PD which is enabled to a logic high level when the all-bank refresh signal REF_ALL is enabled to a logic high level. The latch circuit 133_2 may generate the driving control signal REF_PD which is disabled to a logic low level after a predetermined period from a point of time that the driving control signal REF_PD is enabled to a logic high level.

Figure 18:
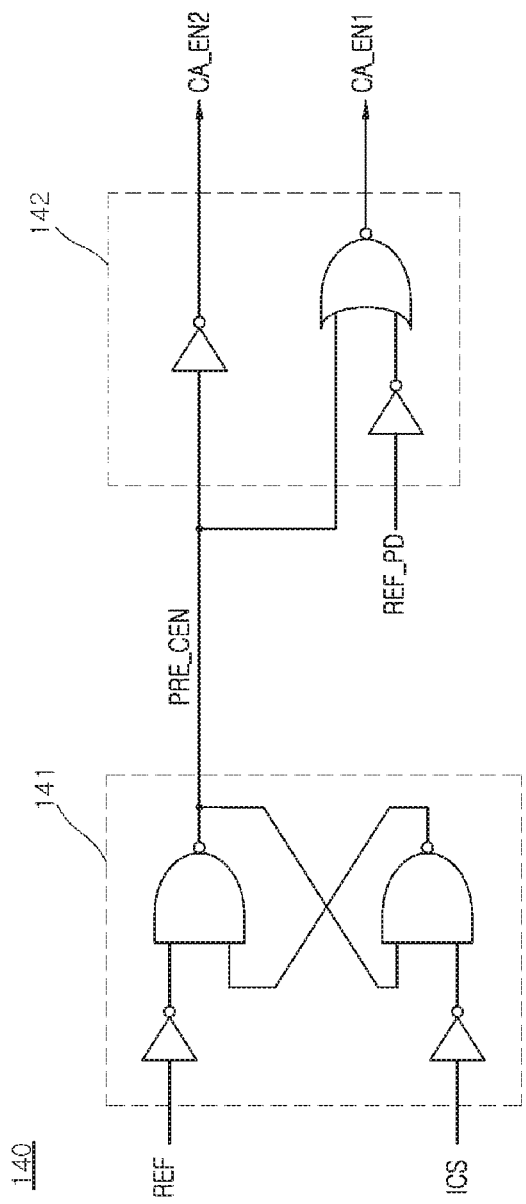
FIG. 18 is a circuit diagram illustrating a configuration of a buffer control circuit included in the electronic device illustrated in FIG. 1.

Referring to FIG. 18, the buffer control circuit 140 may include a pre-enable signal generation circuit 141 and a buffer enable signal generation circuit 142.

The pre-enable signal generation circuit 141 may generate a pre-enable signal PRE_CEN which is enabled from a point of time that the refresh command REF is inputted to a point of time that the internal chip selection signal ICS is inputted. The pre-enable signal generation circuit 141 may generate the pre-enable signal PRE_CEN which is enabled to a logic high level at a point of time that the refresh command REF is inputted at a logic high level. The pre-enable signal generation circuit 141 may generate the pre-enable signal PRE_CEN which is disabled to a logic low level at a point of time that the internal chip selection signal ICS is inputted at a logic high level.

The buffer enable signal generation circuit 142 may generate the first buffer enable signal CA_EN1 by inverting and buffering the pre-enable signal PRE_CEN. The buffer enable signal generation circuit 142 may generate the second buffer enable signal CA_EN2 by inverting and buffering the pre-enable signal PRE_CEN during a period in which the driving control signal REF_PD is enabled. The buffer enable signal generation circuit 142 may generate the second buffer enable signal CA_EN2 by inverting and buffering the pre-enable signal PRE_CEN during a period in which the driving control signal REF_PD is enabled to a logic high level.

Referring to FIGS. 1 to 18, the operation of performing the first internal operation when the all-bank refresh operation is performed during the refresh operation of the electronic device for controlling command input in accordance with the present embodiment will be described as follows.

The internal clock generation circuit 110 generates the internal clock ICLK by dividing the frequency of the clock CLK.

The buffer circuit 120 generates the internal chip selection signal ICS and the first to 11th internal command addresses ICA<1:11> from the chip selection signal CS and the first to 11th command addresses CA<1:11>. At this time, the internal chip selection signal ICS is generated at a logic low level, the first internal command address ICA<1> is generated at a logic high level, the second internal command address ICA<2> is generated at a logic high level, the third internal command address ICA<3> is generated at a logic low level, the fourth internal command address ICA<4> is generated at a logic low level, and the fifth internal command address ICA<5> is generated at a logic high level. The 11th internal command address ICA<11> is generated at a logic low level.

The command generation circuit 130 generates the refresh command REF which is enabled to a logic high level according to a logic level combination of the internal chip selection signal ICS and the first and second groups of internal command addresses ICA<1:11>, in synchronization with the internal clock ICLK. The command generation circuit 130 generates the driving control signal REF_PD which is enabled to a logic high level by the logic-high refresh command REF and the logic-low 11th internal command address ICA<11>.

The buffer control circuit 140 generates the first buffer enable signal CA_EN1 disabled to a logic low level and the second buffer enable signal CA_EN2 enabled to a logic high level, from the refresh command REF and the driving control signal REF_PD.

The core circuit 150 performs the all-bank refresh operation on the first to eighth banks BK1 to BK8 according to the refresh command REF.

The buffer circuit 120 disables the first group of buffers according to the logic-low first buffer enable signal CA_EN1. The buffer circuit 120 enables the second group of buffers according to the logic-high second buffer enable signal CA_EN2. The buffer circuit 120 generates the second internal command address ICA<2> and the fifth internal command address ICA<5> from the second command address CA<2> and the fifth command address CA<5> through the second group of buffers. That is, the buffer circuit 120 generates the second group of internal command addresses ICA<2,5>.

The command generation circuit 130 generates the first internal command WT which is enabled to a logic high level according to a logic level combination of the internal chip selection signal ICS and the second group of internal command addresses ICA<2,5> in synchronization with the internal clock ICLK.

The core circuit 150 performs a write operation of storing data by compensating for the resistance value of an input/output line through which data are inputted/outputted according to the first internal command WT.

The electronic device 1 in accordance with the present embodiment may disable buffers which receive some command addresses during the all-bank refresh operation of the refresh operation, thereby reducing the current consumption. Furthermore, the electronic device 1 in accordance with the present embodiment may detect the logic level of the command address received through the buffer which receives some command addresses during the refresh operation, and perform internal operations. Thus, the internal operations may be efficiently performed.

Figure 19:
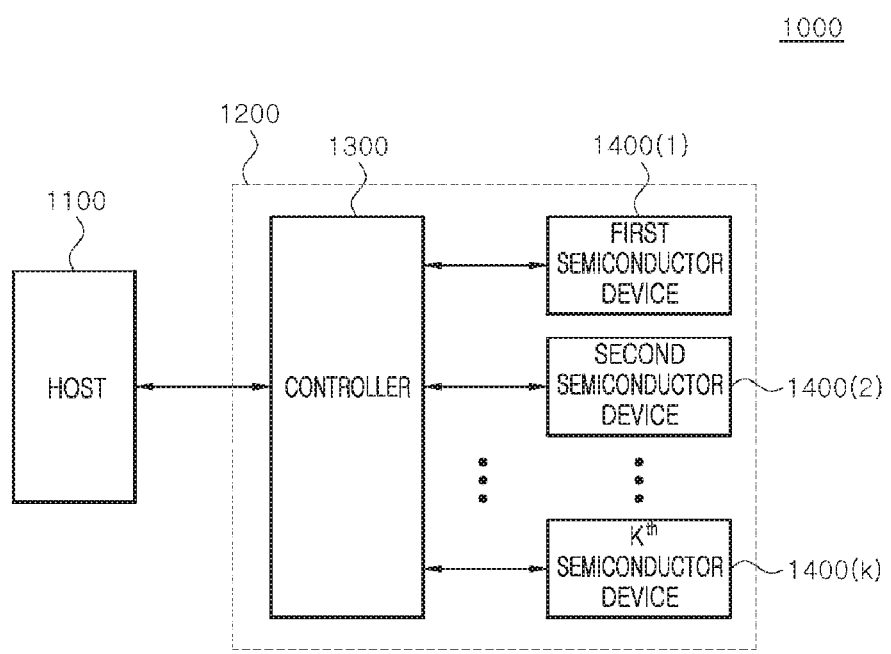
FIG. 19 is a diagram illustrating a configuration of an electronic system in accordance with an embodiment, to which the electronic device illustrated in FIGS. 1 to 18 is applied.

FIG. 19 is a block diagram illustrating a configuration of an electronic system 1000 in accordance with an embodiment. As illustrated in FIG. 19, the electronic system 1000 may include a host 1100 and a semiconductor system 1200.

The host 1100 and the semiconductor system 1200 may transmit/receive signals to/from each other using an interface protocol. Examples of the interface protocol used between the host 1100 and the semiconductor system 1200 may include an MMC (Multi-Media Card), ESDI (Enhanced Small Disk Interface), IDE (Integrated Drive Electronics), PCI-E (Peripheral Component Interconnect—Express), ATA (Advanced Technology Attachment), SATA (Serial ATA), PATA (Parallel ATA), SAS (serial attached SCSI), USB (Universal Serial Bus), and the like.

The semiconductor system 1200 may include a controller 1300 and semiconductor devices 1400(K:1). The controller 1300 may control the semiconductor devices 1400(K:1) to perform a refresh operation, a first internal operation, and a second internal operation. Each of the semiconductor devices 1400(K:1) may disable buffers which receive some command addresses during the all-bank refresh operation of the refresh operation, thereby reducing current consumption. Furthermore, each of the semiconductor devices 1400(K:1) may detect the logic level of the command address received through the buffer which receives some command addresses during the refresh operation, and perform the first and second internal operations. Therefore, the internal operations may be efficiently performed.

Each of the semiconductor devices 1400(K:1) may be implemented as the electronic device 1 illustrated in FIG. 1. According to an embodiment, the semiconductor device 20 may be implemented as one of DRAM (dynamic random access memory), PRAM (Phase change Random Access Memory), RRAM (Resistive Random Access Memory), MRAM (Magnetic Random Access Memory), and FRAM (Ferroelectric Random Access Memory).

While various embodiments have been described above, it will be understood to those skilled in the art that the embodiments described serve as examples only. Accordingly, the electronic device described herein should not be limited based on the described embodiments.

What is claimed is:

1. An electronic device comprising:
   a command generation circuit configured to generate a refresh command and a driving control signal, which are enabled during an all-bank refresh operation, according to a logic level combination of an internal chip selection signal and an internal command address; and
   a buffer control circuit configured to generate, from the refresh command and the driving control signal, a first buffer enable signal for enabling a first group of buffers and a second buffer enable signal for enabling a second group of buffers.

2. The electronic device of claim 1, wherein during the all-bank refresh operation, the first group of buffers are disabled, and the second group of buffers are enabled.

3. The electronic device of claim 1, wherein the internal command address comprises a first group of internal command addresses and a second group of internal command addresses, and
   wherein the electronic device further comprises a buffer circuit configured to generate the internal chip selection signal and the first and second groups of internal command addresses from a chip selection signal, a first group of command addresses, and a second group of command addresses, through the first group of buffers and the second group of buffers which are enabled by the first buffer enable signal and the second buffer enable signal.

4. The electronic device of claim 3, wherein the buffer circuit comprises:
   a chip selection signal buffer circuit configured to generate the internal chip selection signal by buffering the chip selection signal in synchronization with an internal clock;
   a first command buffer circuit comprising the first group of buffers, the first command buffer circuit configured to be enabled by the first buffer enable signal and generate the first group of internal command addresses from the first group of command addresses; and
   a second command buffer circuit comprising the second group of buffers, the second command buffer circuit configured to be enabled by the second buffer enable signal and generate the second group of internal command addresses from the second group of command addresses.

5. The electronic device of claim 4, wherein the first command buffer circuit comprises:
   a first buffer configured to be enabled by the first buffer enable signal and generate a first input command address by buffering the first group of command addresses;
   a first delay circuit configured to generate a first delayed command address by delaying the first input command address; and
   a first transfer circuit configured to generate the first group of internal command addresses from the first delayed command address in synchronization with the internal clock.

6. The electronic device of claim 5, wherein the first buffer is set to the first group of buffers.

7. The electronic device of claim 4, wherein the second command buffer circuit comprises:
- a second buffer configured to be enabled by the second buffer enable signal and generate a second input command address by buffering the second group of command addresses;
- a second delay circuit configured to generate a second delayed command address by delaying the second input command address; and
- a second transfer circuit configured to generate the second group of internal command addresses from the second delayed command address in synchronization with the internal clock.

8. The electronic device of claim 7, wherein the second buffer is set to the second group of buffers.

9. The electronic device of claim 1, wherein the command generation circuit comprises:
- a command input circuit configured to generate an input command from the internal command address according to the driving control signal;
- a command decoder configured to generate the refresh command and an internal command according to a logic level combination of the internal chip selection signal and the input command in synchronization with an internal clock; and
- a driving control signal generation circuit configured to generate the driving control signal which is enabled in a predetermined period by an all-bank information signal and the refresh command which are inputted through the internal command address.

10. The electronic device of claim 1, wherein the buffer control circuit comprises:
- a pre-enable signal generation circuit configured to generate a pre-enable signal which is enabled from a point of time that the refresh command is inputted to a point of time that the internal chip selection signal is inputted; and
- a logic circuit configured to generate the first buffer enable signal by inverting and buffering the pre-enable signal, and generate the second buffer enable signal by inverting and buffering the pre-enable signal during a period in which the driving control signal is enabled.

11. An electronic device comprising:
- a command generation circuit configured to generate a refresh command and a driving control signal, which are enabled during an all-bank refresh operation, according to a logic level combination of an internal chip selection signal, a first group of internal command addresses, and a second group of internal command addresses, and configured to generate an internal command by detecting a logic level combination of the internal chip selection signal and the second group of internal command addresses during the all-bank refresh operation; and
- a buffer control circuit configured to generate, from the refresh command and the driving control signal, a first buffer enable signal for enabling a first group of buffers and a second buffer enable signal for enabling a second group of buffers.

12. The electronic device of claim 11, wherein the internal command is generated from the internal chip selection signal and the second group of internal command addresses which are inputted through the second group of buffers.

13. The electronic device of claim 11, wherein during the all-bank refresh operation, the first group of buffers are disabled, and the second group of buffers are enabled.

14. The electronic device of claim 11, wherein the first group of buffers are enabled to generate the first group of internal command addresses when the first buffer enable signal is enabled, and disabled to block the generation of the first group of internal command addresses when the first buffer enable signal is disabled, and
- the second group of buffers are enabled to generate the second group of internal command addresses when the second buffer enable signal is enabled, and disabled to block the generation of the first group of internal command addresses when the second buffer enable signal is disabled.

15. The electronic device of claim 11, wherein the command generation circuit comprises:
- a command input circuit configured to generate an input command from the first and second groups of internal command addresses according to the driving control signal;
- a command decoder configured to generate the refresh command and the internal command according to a logic level combination of the internal chip selection signal and the input command in synchronization with an internal clock; and
- a driving control signal generation circuit configured to generate the driving control signal which is enabled in a predetermined period by an all-bank information signal and the refresh command which are inputted through the first and second groups of internal command addresses.

16. The electronic device of claim 15, wherein the command input circuit blocks the input of the first group of internal command addresses, when the driving control signal is enabled.

17. The electronic device of claim 15, wherein the command decoder comprises:
- a pre-decoder configured to generate a pre-refresh command and a pre-internal command by decoding the input command address; and
- a synchronization circuit configured to generate the refresh command and the internal command from the pre-refresh command and the pre-internal command when the internal chip selection signal is inputted in synchronization with the internal clock.

18. The electronic device of claim 17, wherein the synchronization circuit comprises:
- a first synchronization circuit configured to generate the refresh command from the pre-refresh command when the internal chip selection signal is inputted in synchronization with the internal clock; and
- a second synchronization circuit configured to generate the internal command from the pre-internal command when the internal chip selection signal is inputted in synchronization with the internal clock.

19. The electronic device of claim 15, wherein the driving control signal generation circuit comprises:
- an all-bank refresh signal generation circuit configured to generate an all-bank refresh signal from the all-bank information signal during a period in which the refresh command is inputted; and
- a latch circuit configured to generate the driving control signal which is enabled by the all-bank refresh signal and disabled after a predetermined period.

20. The electronic device of claim 11, wherein the buffer control circuit comprises:
- a pre-enable signal generation circuit configured to generate a pre-enable signal which is enabled from a point of time that the refresh command is inputted to a point of time that the internal chip selection signal is inputted; and
- a logic circuit configured to generate the first buffer enable signal by inverting and buffering the pre-enable signal, and configured to generate the second buffer enable signal by inverting and buffering the pre-enable signal during a period in which the driving control signal is enabled.

* * * * *